SIGNAL ACTUATED TUNER SELECTIVE OVER NOISE LEVEL

Filed Jan. 28, 1950 2 Sheets-Sheet 1

Inventor
James H. Guyton
By
Willits, Helwig & Baillio
Attorneys

Sept. 25, 1956 J. H. GUYTON 2,764,675

SIGNAL ACTUATED TUNER SELECTIVE OVER NOISE LEVEL

Filed Jan. 28, 1950 2 Sheets-Sheet 2

Inventor

James H. Guyton

By Willits, Helwig & Baillio

Attorneys

United States Patent Office 2,764,675

Patented Sept. 25, 1956

2,764,675

SIGNAL ACTUATED TUNER SELECTIVE OVER NOISE LEVEL

James H. Guyton, Kokomo, Ind., assignor to General Motors Corporation, Detroit, Mich., a corporation of Delaware Application January 28, 1950, Serial No. 141,063

9 Claims. (Cl. 250—20)

This invention relates to tuning means for radio signal receiving apparatus and more particularly to tuning means of the scanning type which is indexed by the presence of a transmitted carrier signal. Tuners of this general type have been termed signal actuated tuners or signal seeking tuners. Some means is provided therein for causing the tuning means of the receiver to scan over the spectrum of the band to be received, and a control voltage pulse is generated by the presence of a resonant signal as a transmitted carrier is encountered in the spectrum. This control voltage pulse then deenergizes the scanning means and stops the apparatus on station by the actual transmitted wave itself. Systems of this general order are described in copending application S. N. 89,132, now Patent No. 2,494,017, issued January 10, 1950, to Andrew G. Tynan and James H. Guyton, filed April 22, 1949, entitled "Electronically Controlled Tuning Means," and S. N. 106,223, now Patent No. 2,652,486, issued September 15, 1953, to James H. Guyton, filed July 22, 1949, entitled "Signal Seeking Tuner." The present application and both above identified co-pending applications are assigned to a common assignee.

When the receiver is designed so that the tuner will stop on very weak stations, it has been found that in some instances spurious signals generated by electrical equipment operated in the vicinity or static atmospheric discharges may, as well as causing noise or interference in the receiver, cause the generation of a sufficiently high voltage to actuate the indexing means and cause the tuner to erroneously stop on such noise signal instead of on an incoming station signal. This, of course, defeats the purpose of the tuner since it no longer stops on stations but stops in a random manner.

It is therefore an object of my invention to provide a signal actuated tuning system for radio apparatus which is substantially unaffected by spurious electrical discharges in the vicinity which cause noise.

It is a further object of my invention to provide a signal actuated tuning system for radio apparatus which will be indexed only by incoming carrier wave signals and not indexed by electrical pulses generated in the tuner control system by electrical discharges either atmospheric or from other electrical equipment operating in the vicinity.

With these and other objects in view which will become apparent as the specification proceeds, my invention will be best understood by reference to the following specification and claims and the illustrations in the accompanying drawings, in which:

The present invention makes use of the fact that the noise created voltages appearing at the output of the last R. F. or I. F. amplifier in a receiver are inherently different in character from the more nearly sinusoidal output voltages resulting from a signal from a radio station. In general, random noise from any source, internal or external, produces an output from the last R. F. or I. F. amplifier which is random in peak voltage and frequency and which drops off rapidly from peak value according to a logarithmic decrement. The resulting noise voltage has an average (and effective) value considerably less than the peak value. Various authorities estimate the random noise ratio $$\frac{\text{peak value}}{\text{effective value}}$$

at approximately 6 to 1. This compares with a sine wave ratio of 1.4 to 1.

Most random external sources of noise such as leaky power lines, neon signs, vibrating contact razor motors, etc., exhibit this same characteristic in the noise they produce.

The envelopes of these noise voltages contain frequencies up to the pass band of the receiver which may be 10 kc. in a standard broadcast receiver. A circuit may then be provided which will rectify these noise voltages and by adjusting the time constants in the diode charging circuits, the average D. C. voltage appearing across the charging condenser may be made to vary from something approaching the peak voltage of the noise to a value approaching the average value of the noise. In addition either of these adjustment conditions may be attained and the diode D. C. output will still closely approach the peak value of any sine wave R. F. signal delivered to it.

It can be seen that a detector may be devised which will produce a small average rectified D. C. voltage with typical noise input when compared to the voltage produced by a sine wave input of the same peak value.

Figure 1:
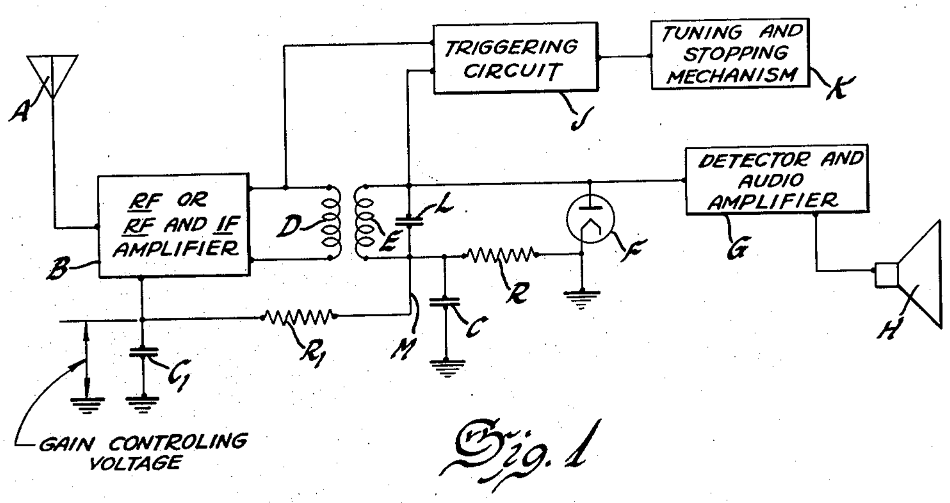
Figure 1 is a block diagram showing a signal controlled tuner circuit embodying one form of my invention applied to the normal radio receiving system.

This factor may then be used to cause signal seeking tuners to ignore noise and stop only on sine wave signals and by its use it is possible to construct radio receivers with signal seeking tuners which will stop in the presence of noise on signals of such low levels that the stations are unintelligible and barely distinguishable through the noise. There are many ways of using this feature and two applications are described below:

Referring now more specifically to Figure 1, there is shown therein a radio receiving system consisting of an antenna A whose output is connected to a radio frequency amplifying section B which in turn feeds into the primary D of the last tuned R. F. transformer. The secondary E of this transformer is connected directly to a diode detector F and thence into the detector and audio amplification portion G of the receiver. The output of the audio amplifier is, of course, connected conventionally to a loud speaker H. Since this is a radio receiver which incorporates means for stopping the tuning means on signal, there is provided a so-called triggering circuit J which is connected across the R. F. transformer D. E. The triggering circuit then feeds into the actual tuning and stopping mechanism K. Between the cathode of the diode rectifier F and the secondary E there is connected a resistance R and one end of the secondary E is connected through condenser C to ground. A condenser L is connected across the secondary E. Line M is connected to one end of the secondary E and extends to a resistance $R_1$, the opposite end of which is connected into the R. F. amplifier to bias the same inversely to provide AVC characteristics, and has a condenser $C_1$ connected between the remote end of the resistance $R_1$ and ground.

The diode F, upon the receipt of a signal, develops a rectified voltage across condenser C which has, as will be obvious, a leakage path through resistance R to ground. The voltage developed across condenser C is fed back to the R. F. amplifier through the circuit consisting of resistance $R_1$ and condenser $C_1$ in inverse phase so that as the developed voltage increases, the gain of the amplifier is reduced. By so selecting the values of the resistor R and the condenser C and making them large enough to produce voltage approaching the peak value of any R. F. noise voltage appearing at the last R. F. tuned circuit an inordinately large AVC voltage will be developed and, therefore, the gain of the amplifier will be reduced to the point where only stronger station signals will operate the tuner stopping device. This effect could be further increased by amplifying the control voltage before application back to the amplifier. Of course, the rectifiers in the triggering circuit J, which may be of the type described in my Patent 2,652,486, Signal Seeking Tuner, filed July 22, 1949, and are designed with faster time constant circuits which ignore noise and operate at maximum efficiency only on the sinusoidal signals to stop the tuner. As exemplary of actual values of R and C which may be used in a commercial installation, $R=2$ megohms and $C=500$ micro-micro-farads. These values will give AVC voltages when stopped on station proportional to the peak of the received signal which will be a function of modulation percentage. For this reason it will usually be desirable to switch the AVC circuit to more conventional values when the set is receiving a station and to switch back to other values when tuning.

Figure 2:
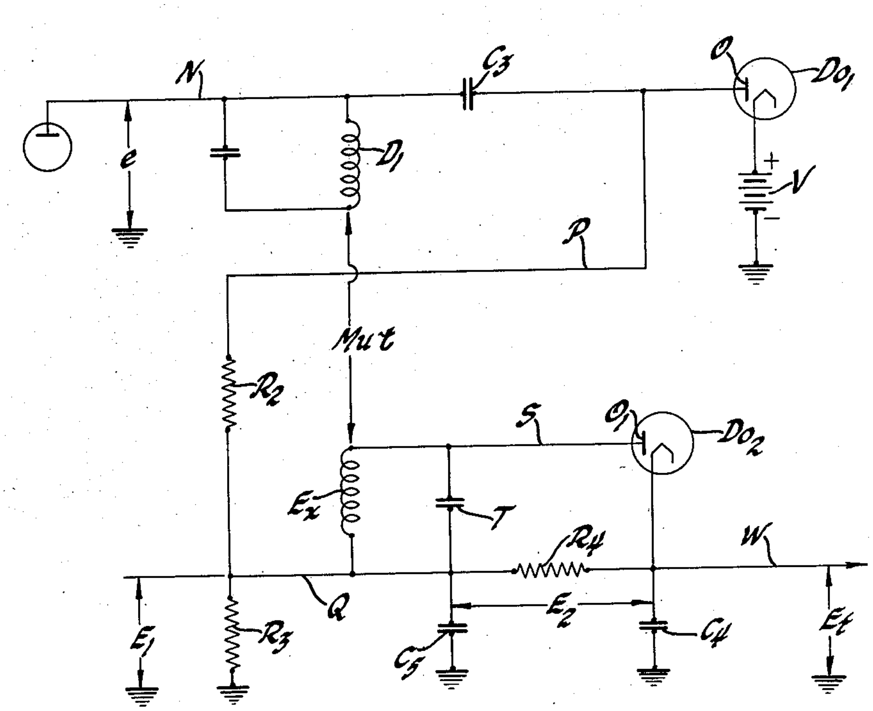
Figure 2 is a simplified circuit diagram showing a second form of my invention as applied to a similar radio receiving system.

In Figure 2 there is shown another system for adjusting the time constants of a triggering circuit such as that described in my Patent 2,652,486 so that insufficient triggering voltage will be developed to stop the tuner except when a sinusoidal signal is encountered. In the showing in Figure 2 the two coils $D_1$ and $E_x$ are the primary and secondary respectively of the last R. F. transformer of the set, as shown in Figure 1. These two coils, of course, have mutual inductance indicated as mut and the incoming signal is fed in on line N and is identified as voltage *e*. A condenser $C_3$ is connected between transformer coil $D_1$ and the anode O of diode $DO_1$. The cathode of the diode $DO_1$ is connected to the positive side of a battery V, the negative side of which is grounded. The anode O of the diode is likewise connected through line P to resistor $R_2$ which is in turn connected in series with resistor $R_3$ and thence to ground. At a mid-point between resistors $R_2$ and $R_3$, conductor Q is connected and extends to one end of the transformer coil $E_x$ and also to a resistor $R_4$, the opposite end of which is connected to the cathode of a diode $DO_2$. The anode $O_1$ of the diode is connected through line S with the opposite side of the transformer coil $E_x$. A condenser T is connected across coil $E_x$ and condensers $C_5$ and $C_4$ are connected from opposite ends of resistor $R_4$ to ground.

In this form of my invention, such as is basically shown in Patent 2,652,486 above referred to, the triggering voltage $E_t$ which is shown as developed on control line W is developed by two voltages which are connected in opposition to each other. These two voltages $E_1$ and $E_2$ are developed across resistors $R_3$ and $R_4$ respectively as shown.

If: K=voltage ratio of the R. F. transformer and if we adjust:

$$\frac{R_3}{R_2+R_3} \text{ to } K$$

then:

$$E_t=E_1-E_1$$

where:

$$E_1=\frac{R_3}{R_2+R_3}(e-v) \text{ (assuming peak rectification)}$$

and:

$$E_2=ke \text{ (assuming peak rectification)}$$

so:

$$E_t=ke-k(e-v)=kv$$

However, if with noise input envelope peak rectification is only produced in diode $DO_1$, and less than envelope peak rectification on diode $DO_2$, the balance between these voltages will be upset and an inordinate amount of voltage will appear at $E_1$ as compared to the voltage $E_2$ and the trigger voltage $E_t$ will be insufficient (in a positive direction which is the pulse used for indexing) to stop the tuning mechanism. The time constant circuit for $E_1$ is determined by condenser $C_3$ and resistors $R_2$ and $R_3$, whereas the time constant circuit for $E_2$ consists of resistor $R_4$ and condensers $C_4$ and $C_5$ in series.

As exemplary of practical values which might be used for a given installation, they may be listed as follows:

$C_3$=100 to 200 $\mu\mu$fd.
$R_2$ and $R_3$=2.5 megohms
$R_4$=0.3 megohm
$C_5$ and $C_4$ in series=100 to 200 $\mu\mu$fd.

$C_3$ and $R_2$ and $R_3$ must not be increased to too large a value or the trigger voltage $E_t$ will not appear when tuning into a signal which has a high percentage modulation of higher audio frequencies. The percentage of time that stations operate under this condition, however, is small and in practice the tuner will ignore noise and only rarely pass over a station of sufficient strength to normally stop the tuning means. Also, the mechanical and electrical lag in the circuits and mechanical tuner stopping device must be enough to prevent the tuner from stopping on any sharp high noise pulse that may momentarily produce a voltage at $E_t$ sufficient to stop the tuner. This, however, is more of a theoretical point and presents no problem in a practical tuner since the difficulty is usually the reverse; i. e., to make the electrical and mechanical device operate with sufficient speed to prevent overshooting a station. Practical applications of the principles pointed out with respect to Figures 1 and 2 are incorporated in the systems shown in Figures 3 and 4 to be presently described.

Figure 3:
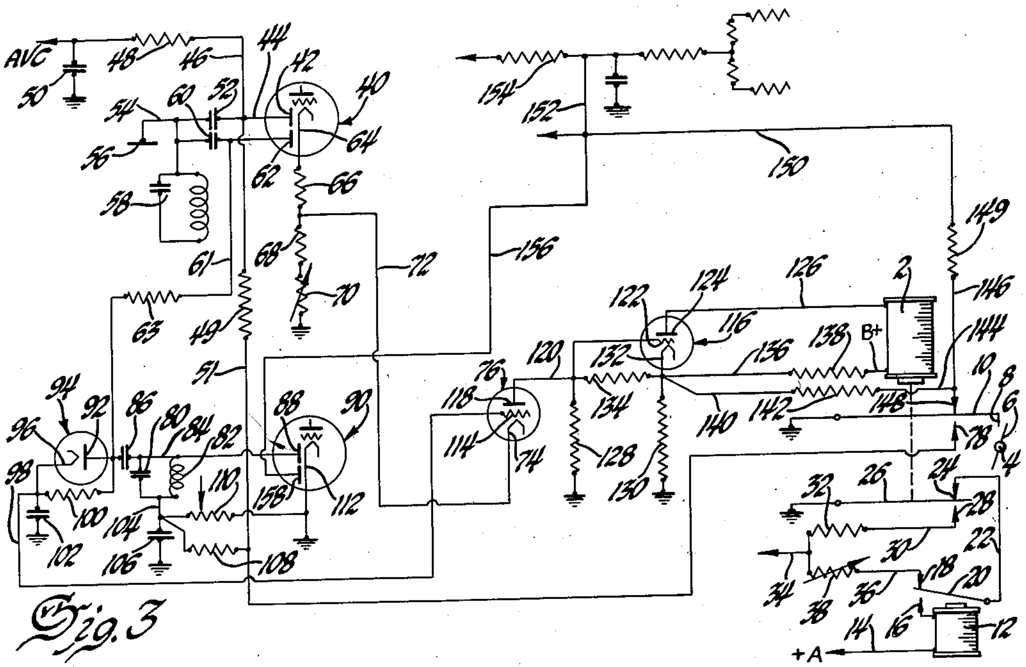
Figure 3 is a circuit diagram showing a practical application embodying my invention as shown generally in Figure 1.

Referring now more specifically to Figure 3 there is shown therein a main control relay 2 which controls the scanning and indexing operation of the receiver. As mentioned, the tuning means for the receiver is driven by some means so that it continuously scans the frequency band, and in this instance the motor-driven means for scanning is shown diagrammatically as a shaft 4 having a vane 6 attached thereto which vane cooperates with a flanged indexing end 8 on armature 10, which is moved by relay 2. Thus, when flanged end 8 engages member 6, the motor is stopped and the set indexed to a particular station, but when the armature 10 is drawn upwardly by energization of relay coil 2, flange 8 is removed from engagement with member 6 and the motor may operate.

In the particular type of system used for illustrative purposes herein, the motor used is a spring motor for driving in one direction, said spring being cocked by a solenoid which in this instance is diagrammatically shown at 12, said solenoid having one terminal connected to a source of power through line 14, and its other terminal connected to a stationary contact 16. In spaced relation to contact 16 is a second stationary contact 18 and between these two contacts there is an oscillatory switch arm 20 which is connected through line 22 to stationary contact 24. Contact 24 is adapted to be engaged by a second movable armature 26 operated by main control relay 2, and armature 26 is connected to ground as shown. Armature 26 in addition to contacting stationary contact 24 when relay 2 is energized, falls back to engage a stationary contact 28 when relay 2 is deenergized. Contact 28 is connected through conductor 30 to a resistor 32 and thence through a common lead 34 to the cathode circuits of the R. F. and I. F. tubes. Stationary contact 18 is connected similarly through line 36 and variable resistor 38 to line 34 and the cathodes. This portion of the system is the same as that described in the previous applications.

Tube 40 is a detector tube of the radio receiver and generates on anode 42 the normal AVC voltage for the system. This element is connected through line 44 to line 46 and thence through resistor 48 and condenser 50 to the AVC control line for the receiver. Line 44 is also connected through condenser 52 and line 54 to the plate 56 of the previous I. F. amplifier. Line 54 in turn is connected to, first, the primary resonant circuit 58 of the I. F. coupling transformer and, secondly, to one side of a condenser 60, the opposite side of which is connected directly to an anode 62 in the tube 40. The filament 64 of the tube 40 is connected through three resistances 66, 68 and 70 in series to ground, the last resistor 70 being variable. A conductive line 72 is connected to a point between the resistors 66 and 68 and to the cathode 74 of control triode 76.

Line 46, upon which the AVC voltage appears, extends also to resistor 49 whose opposite terminal is connected through line 51 to a stationary contact 78, which is a back contact engaging armature 10, said armature 10 being grounded as shown, which, therefore, applies a ground to the line 51 when the relay 2 is deenergized. A fixed resonant circuit consisting of condenser 80 and inductance 82 represents the secondary side of the I. F. transformer, the primary side of which is represented by the circuit 58. These two circuits should be considered as being in close inductive relationship. Line 84, connected to the secondary resonant circuit, is also connected to a condenser 86 and to an anode 88 of the tube 90. Condenser 86 is likewise coupled to the anode 92 of a control diode 94, the opposite element 96 of which is connected to control line 98. A resistor 100 is connected directly across the diode and a condenser 102 connects one end of the resistance to ground.

The opposite side of the secondary resonant circuit of the I. F. transformer is connected to line 104 and thence through condenser 106 to ground. A resistance 108 is interconnected between line 51 and line 104 and a second variable resistance 110 is connected between line 104 and the filament 112 of tube 90. Line 61 is connected to anode 62 of tube 40 and extends to resistor 63, the opposite terminal of which is connected to anode 92 of tube 94. Line 98 extends to the control grid 114 of tube 76 and this tube is the D. C. amplifier tube for the control tube 116 of relay 2. The plate 118 of tube 76 is connected through line 120 directly to the control grid 122 of tube 116, the plate 124 of which is connected directly through line 126 with relay 2. A resistor 128 is connected between line 120 and ground and another resistor 130 connects the filament 132 of the tube 116 to ground. A third resistor 134 is interconnected between line 120 and filament 132 of the tube. Line 136 is connected to the tube filament 132 and also to a resistance 138, the other end of which is connected directly to the relay coil 2. A further line 140 connects the filament 132 with resistor 142, the opposite end of which is connected through line 144 to line 146. Line 146 terminates in a stationary contact 148 which engages the armature 10 when the latter is in its uppermost position. Line 146 extends to resistor 149 and thence through line 150 back to the first audio grid. This line is also connected through line 152 to a resistor 154 which extends to a source of approximately 10 volts below ground potential. Line 150 is also connected by line 156 to anode 158 of tube 90.

In the operation of the system as shown in this figure, let it be assumed that the relay tube is energized and has attracted its armatures 10 and 26. Armature 10, in moving upwardly, has removed the mechanical obstruction 8 to the rotation of the motor and the same, therefore, operates to cause the tuning means to scan over the band. Inasmuch as this is a spring motor, it drives the mechanism in one direction only and during that driving period armature 20 is in the position shown, which completes a circuit from the cathodes of the R. F. and I. F. tubes through line 34, sensitivity control 38, which is adjustable, line 36, switch contact 18, arm 20, line 22, switch contact 24, armature 26 to ground, thus placing the radio receiver in condition to receive signals at a desired sensitivity, depending on the setting of resistor 38. Assuming that the motor drive continues until it reaches one extreme of its movement, it then mechanically forces switch arm 20 from the position shown to that where it contacts stationary contact 16, opening the sensitivity control circuit to deenergize the amplifier tubes and at the same time closing an obvious circuit through solenoid 12 to ground. This energizes solenoid 12, which is the re-cocking solenoid for the spring motor, and it therefore quickly returns the spring motor to the fully cocked opposite end position, at which time the mechanical obstruction on the tuning means forces switch arm 20 back to the position shown, breaking the solenoid circuit and again completing the circuit for the amplifier cathodes. This provides a scanning or sweep travel in one direction and a quick re-cocking action in the opposite, and a deenergizing of the amplifier tubes during the re-cocking.

Let it next be assumed that an incoming signal is encountered of sufficient strength to cause the D. C. amplifier tube 76 to conduct, due to the fact that a positive voltage appears on line 98, resulting from the combination of a signal in the I. F. primary circuit 58 and one in the I. F. secondary circuit 80—82. These two voltages are mixed and applied to control line 98, which is connected to control grid 114 of tube 76, and when a sufficiently large voltage appears therein due to an incoming signal, tube 76, which has been biased to cut off, conducts, lowering the voltage on control grid 122 of control tube 116 to cause deenergization of the same, deenergizing relay 2, which then drops its armatures 10 and 26 to mechanically stop the motor, and ground the end of line 46, as well as switching from sensitivity control rheostat 38 to sensitivity control resistor 32. These different degrees of sensitivity of the receiver are obtained during scanning or tuning and during reception.

If now we assume that the tuning motor is still proceeding with its scanning, no station of sufficient strength having been encountered to cause it to index, and some static or generated discharge noise is encountered, a voltage is generated across resistor 110 due to the action of detector amplifier tube 90, this resistor being placed, as will be seen, across a diode section 88—112 of the tube (90). This static generated voltage drives the left end of the resistor 110 negative and develops what might be termed an AVC voltage back on line 51 to make the set less sensitive and, therefore, more station input signal will be required to produce enough voltage on diode anodes 62 and 92 to stop the tuning motor and short noise pulses will be ineffective to operate the indexing means. By satisfactorily selecting the values of the resistance 110 and condenser 106, this AVC voltage can be made large enough so that only fairly strong signals of longer duration will produce a triggering voltage sufficient to stop the tuner. The time constants of the leakage circuits for diode anodes 62 and 92 are made fast enough to follow the noise envelopes but slow enough to give peak rectification on R. F. signal input.

It should also be pointed out at this time that during the two portions of the cycle there are different degrees of AVC control; that is, during the tuning portion of the cycle there is no delay in the AVC action due to the fact that line 51 is not connected to ground through switch contact 78 because armature 10 is not connected thereto, but during normal receiving action on station, armature 10 is in its lower position, completing the circuit between line 51 and ground, which replaces the delay circuit for the AVC, and it does not then operate on low input signal (or noise) voltages. Therefore, extraneous spurious electrical discharges will not trigger the system to cause the tuning means to stop, but on the contrary will reduce the sensitivity of said system immediately a predetermined amount to prevent triggering except when encountering developed sine voltages of sufficient strength from desired stations to operate the system.

Figure 4:
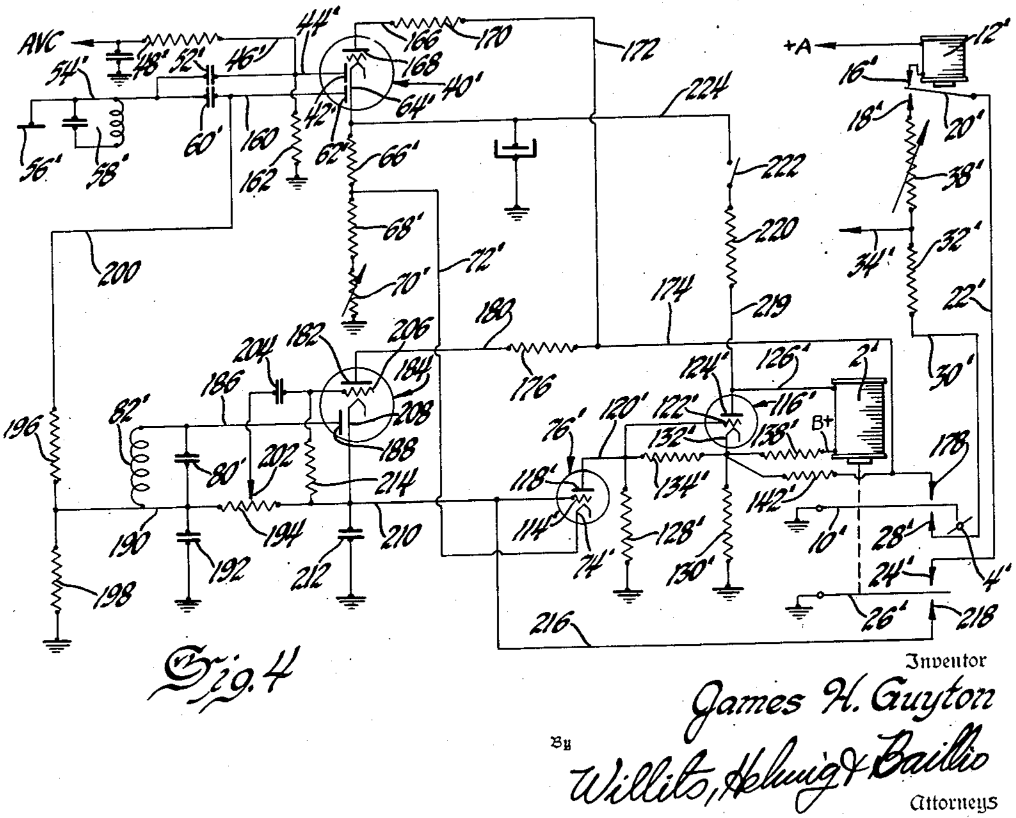
Figure 4 is a circuit diagram showing a practical application of my invention as illustrated in Figure 2 in a similar radio receiving system.

The modification shown in Figure 4 contains an number of the same elements as the system of Figure 3 and in that case there is provided a cocking solenoid 12', a main control relay 2', a control tube 116', and a trigger tube 76'. As in previous instances, the control relay is provided with two simultaneously moving armatures 10' and 26', and the diode anode 62' in tube 40' is also utilized as previously. Anode 42' of this detector is similarly connected through line 44' to the AVC control line 46' and also to a condenser 52', which is in turn connected to the plate 56' of the previous amplifier tube. A fixed resonant circuit 58' of the I. F. transformer between these two tubes is connected as before to common line 54' and line 54' is connected to a second condenser 60'. The opposite side of condenser 60' is connected through line 160 to anode 62' of the tube 40'. A plurality of series resistances 66', 68' and 70' are again connected between the filament 64' of the tube 40' and ground. Line 166 interconnects plate 168 of the tube 40' with resistor 170, the opposite side of said resistor 170 being connected by line 172 to an interconnecting line 174. Line 174, on the other hand, connects one end of resistor 176 with stationary switch contact 178, and also to one end of resistor 142'. The opposite end of resistor 176 is connected through line 180 to plate 182 of control tube 184. Line 72', as previously, connects an intermediate point between resistor 66' and 68' with filament 74' of tube 76'. The secondary resonant circuit of the I. F. transformer, which is in inductive relation with the primary, is formed as previously of condenser 80' and inductance 82' and in this instance one side of this resonant circuit is connected through line 186 with anode 188 of tube 184. The opposite side of the resonant circuit is connected to line 190 and that line is connected to ground through condenser 192. It is also connected to one side of a variable tap resistor 194 and also to an intermediate point between two resistances 196 and 198 in series. The opposite end of resistor 198 is connected to ground and the opposite side of resistance 196 is connected through line 200 to line 160. The variable tap 202 of the resistance 194 is connected through condenser 204 to the control grid 206 of tube 184. The cathode 208 of the tube 184 is connected to line 210 and that line is connected to ground through condenser 212. A resistor 214 is connected across the grid and filament. Line 210 is directly connected to control grid 114' of the trigger tube 76' and is also connected to an interconnecting line 216, which terminates in stationary contact 218 cooperating with armature 26' of the main relay. Plate 118' of the tube 76' is connected through line 120' to the control grid 122' of tube 116', as previously, and plate 124' of tube 116' is directly connected to the main relay through line 126'. This line is also tapped onto line 218, which is in turn connected to resistor 220 and switch 222 in series, continuing through line 224 to the filament 64' of the detector tube 40'. Filament 132' of the control tube 116' is connected through resistor 138' with the main relay and also through resistance 142' to stationary contact 178 and through resistor 130' to ground. B+ power is connected to the tower relay terminal. Line 120' is, as previously, grounded through resistor 128' and resistance 134' is connected between line 120' and filament 132'.

Variable resistance 38', the sensitivity control, is connected as before to stationary contact 18', cooperating with armature 20' of relay coil 12', said armature also engaging a spaced stationary contact 16', as before. Resistance 32' is, as previously, connected through line 30' to stationary contact 28', and the intermediate point of these two resistances 32' and 38' is connected through line 34' back to the amplifier tube cathodes. Armature 20' of the relay 12' is connected through line 22' to contact 24', which is adapted to engage armature 26' of the main relay when in its upper-most position. In the operation of this modification, that portion of the system including the driving motor 4', the cocking solenoid 12', alternate sensitivity controls 32' and 38', main relay 2', control tube 116' and trigger tube 76' operate as previously. Thus, the scanning action and switching previously described will also cover this form.

The AVC voltage in this system is not developed until a reasonably strong signal appears across inductance 58' and is developed upon line 46' from diode anodes 42'—62' of tube 40', and the control pulse which is generated by the voltages developed from the I. F. transformer primary and secondary resonant circuits is fed to line 210 to cause the trigger tube 76' to operate. In this modification, however, there are provided two time constant circuits having different values to accomplish the desired end of preventing erroneous stopping due to voltages developed from spurious sources. The first time constant circuit consists of resistors 196 and 198 and condenser 60'. The time constant of this circuit is designed to be relatively long and at least long enough to allow peak envelope rectification of the voltage pulses caused by the noise. The second time constant circuit, which consists of condensers 192 and 212 in series and resistor 194, is made fast enough to develop very little positive trigger voltage on noise but does give peak rectification on R. F. continuous waves and, therefore, permits a leakage off of noise voltages so that they will not be impressed upon the trigger tube grid 114 and cause an erroneous triggering thereof.

An additional feature is incorporated in this design in that while tuning, that is, with the relay coil 2' energized and armature 10' in its raised position, plate 182 of tube 184 is connected to ground through said armature and, therefore, no plate voltage exists thereon, which keeps the plate current from raising the cathode voltage. This also prevents an extraneous trigger voltage from rising, and automatically prevents the audio system in the receiver from amplifiying while the tuner is searching for another station.

I claim:

1. In radio receiving apparatus having power actuated tuning means to repetitively scan the frequency spectrum, an intermediate frequency amplifier and a detector section, inductive coupling means between the intermediate frequency amplifier and detector in which voltages proportional to incoming signals are developed, relay means for controlling said power actuated means, a first rectifier and time constant circuit connected to one part of the inductive coupling, a second rectifier and time constant circuit connected to another part of the inductive coupling having a time value several times that of the first and connected in opposed voltage relation to the first and control means connected to the relay means to operate the same and also connected to the output of the opposed rectifier time constant circuits so that resultant signals appearing on said circuits operate to discriminate between wave forms and actuate the control means for the relay and in turn index the power actuated means.

2. In radio receiving apparatus having power actuated tuning means to repetitively scan the frequency spectrum, an intermediate frequency amplifier and a detector section, transformer means having a primary and secondary winding coupling the intermediate frequency amplifier and the detector, a first diode and time constant circuit connected to said transformer primary, a second diode and time constant circuit connected to the transformer secondary, said two time constant circuits being connected in opposed voltage relation one having a value several times the other, relay means connected to the power actuated means to control the same and control means connected to relay means and to the output of the combined diode and time constant circuits to determine relay operation dependent upon the signal wave form characteristics in the amplifier.

3. In radio receiving apparatus having power actuated tuning means to repetitively scan the frequency spectrum, an intermediate frequency amplifier and a detector section, inductive coupling means between the amplifier and detector, a first diode and time constant circuit connected to one side of the inductive coupling means, a second diode and time constant circuit connected to the other side of the inductive coupling means and in opposed voltage relation to the first diode and time constant circuit and having a value several times the first, relay means connected to the power actuated means, electronic control means connected to the relay means and to the output of the combined diode and time constant circuits so that signals developed in the amplifier will be selectively applied to control the power actuated means dependent on signal wave form characteristics.

4. In radio receiving means having power actuated tuning means to repetitively scan the frequency band, means for controlling the power actuated means to index the same upon receipt of an incoming signal, conductive means upon which a voltage is developed upon receipt of any signal, a plurality of rectifying means connected to the conductive means and together in opposed relation to develop a composite control pulse, means for connecting the combined output of the rectifying means to the means for controlling the power means and time constant means connected to each rectifier having differing values to provide differing opposition relationships for the rectifier output with different wave forms so that sharp short waves will be absorbed by one time constant means and no combined output pulse will be developed but longer waves will generate composite control pulses.

5. In radio receiving apparatus having power actuated tuning means to repetitively scan the frequency spectrum, an intermediate frequency amplifier and a detector section, transformer means having a primary and secondary winding coupling the intermediate frequency amplifier and the detector, a first time constant circuit of comparatively high value connected to the primary, rectifying means connected to the primary and to the time constant means, a second rectifying means connected to the secondary, a second time constant circuit connected to the secondary and the second rectifying means of much smaller value than the first, said two rectifying means being connected in opposition to provide a combined output, means connecting the output of the rectifying means to the power actuated tuning means to control the operation of the same.

6. In radio receiving apparatus having power actuated tuning means to repetitively scan the frequency spectrum, an intermediate frequency amplifier and a detector section, transformer means having a primary and secondary winding coupling the intermediate frequency amplifier and the detector, a first time constant circuit of comparatively high value connected to the primary, rectifying means connected to the primary and to the time constant means, a second rectifying means connected to the secondary, a second time constant circuit connected to the secondary and the second rectifying means of much smaller value than the first, said two rectifying means being connected in opposition, relay means controlling the operation of the power actuated tuning means, electronic control means for the relay means and conductive means connected to the electronic control means and to the rectifying means upon which a control pulse is generated to control the tuning means.

7. In radio receiving means having power actuated tuning means to repetitively scan the frequency spectrum, conductive means upon which a voltage is developed upon receipt of any signal, a plurality of rectifying means connected to the conductive means and together in opposed relation to produce a composite control pulse, time constant means connected to each rectifier means having differing time values to provide differing opposition relationships for rectifier output with different wave forms of voltage, electronic control means for the power actuated means having a control electrode and means connecting the control electrode to the combined rectifier output so that the power actuated means will be controlled by said output appearing on the control electrode.

8. In radio receiving apparatus having power actuated tuning means to repetitively scan the frequency spectrum, an intermediate frequency amplifier and a detector section, inductive coupling means between the amplifier and detector, a first diode and time constant circuit connected to said inductive coupling means, a second diode and time constant circuit connected to the inductive coupling means and in opposed voltage relation to the first diode and having a time constant value several times that of the first time constant circuit, so that unless one voltage exceeds the other for a sufficient time, no composite signal will appear, relay switching means to control the power actuated tuning means, electronic control means normally biased to cut off in the absence of a received signal connected to the relay switching means and to the output of the opposed diodes to be driven conductive when the composite output of the diodes becomes positive, so that the relay switching means is actuated when a positive voltage is developed by the diode combination.

9. In radio receiving means having power actuated tuning means to repetitively scan the frequency spectrum, conductive means in said receiving means upon which a voltage is developed upon receipt of a signal in the receiving means, a plurality of rectifier means connected to the conductive means and together in opposed voltage relation to produce a composite positive control pulse when the positive voltage predominates over the negative, time constant means connected to each rectifier means and having different time values, said time constant means connected to the rectifier means tending to produce the positive voltage factor in the resultant control pulse being the fast time constant circuit to give different composite voltage relationships for different wave forms, electronic means connected to the composite rectifier means output and controlled by the pulse therefrom and relay switching means connected to the electronic means and the power actuated tuning means and controlled by said electronic means.

References Cited in the file of this patent

UNITED STATES PATENTS

| | | |
|---|---|---|
| 2,108,420 | Van Loon | Feb. 15, 1938 |
| 2,207,467 | Muller | July 9, 1940 |
| 2,252,066 | Dallos | Aug. 12, 1941 |
| 2,550,430 | Schwartz et al. | Apr. 24, 1951 |

FOREIGN PATENTS

| | | |
|---|---|---|
| 505,276 | Great Britain | Aug. 3, 1937 |